(12) United States Patent
Willers et al.

(10) Patent No.: US 8,310,327 B2
(45) Date of Patent: Nov. 13, 2012

(54) LOW-PROFILE TRANSFORMER

(75) Inventors: Michael J. Willers, Killeagh (IE);
Raymond Walsh, Blarney (IE);
Christopher Simmonds, Lusk (IE)

(73) Assignee: Moog Limited, Ringskiddy, County Cork (IE)

( * ) Notice: Subject to any disclaimer, the term of this patent is extended or adjusted under 35 U.S.C. 154(b) by 41 days.

(21) Appl. No.: 12/452,832

(22) PCT Filed: Jun. 11, 2007

(86) PCT No.: PCT/IE2007/000056
§ 371 (c)(1),
(2), (4) Date: Apr. 20, 2010

(87) PCT Pub. No.: WO2008/152616
PCT Pub. Date: Dec. 18, 2008

(65) Prior Publication Data
US 2010/0219926 A1      Sep. 2, 2010

(51) Int. Cl.
*H01F 5/00* (2006.01)
*H01F 27/30* (2006.01)
(52) U.S. Cl. .......... 336/200; 336/205; 336/207
(58) Field of Classification Search .......... 336/200, 336/223, 232, 199, 205, 206, 207, 208
See application file for complete search history.

(56) References Cited

U.S. PATENT DOCUMENTS

| | | | |
|---|---|---|---|
| 4,622,627 A * | 11/1986 | Rodriguez et al. | 363/37 |
| 4,816,784 A * | 3/1989 | Rabjohn | 333/24 R |
| 6,069,548 A * | 5/2000 | Baarman et al. | 336/65 |
| 6,073,339 A * | 6/2000 | Levin | 29/606 |
| 6,147,583 A * | 11/2000 | Rinne et al. | 336/200 |
| 6,281,779 B1 * | 8/2001 | Matsumoto et al. | 336/200 |
| 6,741,155 B2 * | 5/2004 | Usui | 336/200 |
| 6,788,184 B2 * | 9/2004 | Roche | 336/212 |
| 6,828,894 B1 * | 12/2004 | Sorger et al. | 336/200 |
| 6,914,508 B2 * | 7/2005 | Ferencz et al. | 336/200 |
| 7,248,138 B2 * | 7/2007 | Chiang et al. | 336/200 |
| 7,298,238 B1 * | 11/2007 | Eaton et al. | 336/200 |
| 7,705,705 B2 * | 4/2010 | Zeng et al. | 336/212 |
| 7,889,041 B2 * | 2/2011 | Minteer | 336/200 |
| 7,905,008 B2 * | 3/2011 | Yoshida et al. | 29/602.1 |
| 7,915,992 B2 * | 3/2011 | de Rooij et al. | 336/200 |
| 8,013,708 B2 * | 9/2011 | Tsai | 336/200 |
| 2008/0278275 A1 * | 11/2008 | Fouquet et al. | 336/84 M |

* cited by examiner

*Primary Examiner* — Mohamad Musleh
*Assistant Examiner* — Joselito Baisa
(74) *Attorney, Agent, or Firm* — Phillips Lytle LLP

(57) ABSTRACT

The present invention provides an improved transformer (20), which broadly includes: a substrate (21) having first and second surfaces (22, 23); a first board (24) mounted on the substrate first surface; a second board (25) mounted on the substrate second surface; the boards being identical to one another and being mounted on the respective proximate substrate surfaces as mirror images of one another; each of the boards having a plurality of dielectric layers with electrically-conductive sheet windings (35, 36, 37, 38) embedded therein; and an assembled core (26, 28) operatively arranged to provide a path for magnetic flux attributable to a current in some of the windings. Third and fourth boards (71, 72) may be piggy-backed onto the first and second boards, respectively, to selectively vary the properties of the transformer.

25 Claims, 10 Drawing Sheets

LOW-PROFILE TRANSFORMER

TECHNICAL FIELD

Figure 1:
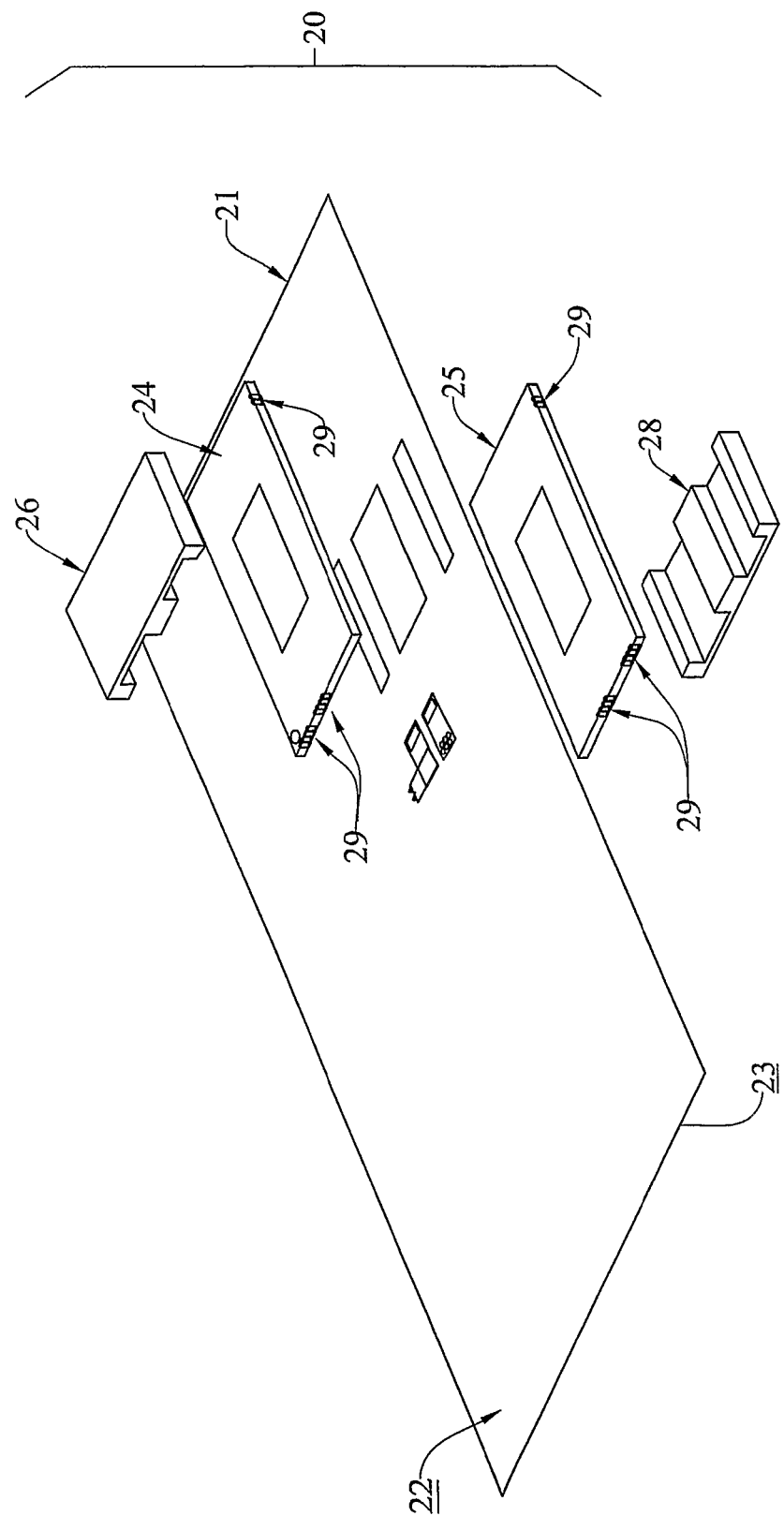

The present invention relates generally to the field of electrical transformers for possible use in motor drive applications, and, more particularly, to improved low-profile transformers that may be mounted on and integrated with a suitable substrate, such as a printed circuit board (PCB), containing some transformer components.

BACKGROUND ART

Van Nostrand's Scientific Encyclopedia defines a transformer as being a device for transferring electrical energy from one circuit to another by magnetic induction, usually with an accompanying change of voltage. There are no moving parts; nor is there any electrical connection between the two circuits (except in the case of an auto-transformer). The electrical energy is transferred via the magnetic linkage. The energy-supplying circuit is termed the "primary", and the energy-receiving circuit is termed the "secondary".

Some transformers employ three-dimensional bobbin-wound coils. Others employ relatively-planar or substantially two-dimensional sheet windings that are embedded in various dielectric layers of a printed circuit board. For example, U.S. Pat. No. 6,353,379 B1 discloses a transformer spanning multiple printed circuit boards. Each board has a multi-layer structure. Sheet windings are embedded in the various layers. A magnetic core, such as an E-core, may be mounted on the main board. The ostensible purpose of the device is to lower the profile of the dc-dc converter.

U.S. Pat. No. 5,990,776 discloses another type of transformer having sheet windings embedded in various layers of a multi-layer printed circuit board.

U.S. Pat. No. 4,547,961 discloses a miniaturized transformer having sheet windings embedded in various layers of a multi-layer printed circuit board. An E-core embraces the windings.

These references demonstrate that there is an existing and ongoing need to provide a low-profile transformer that utilizes printed circuit board technology, that uses standardizable off-the-shelf components to minimize the number of different component parts in the assembled transformer, and that may use add-on piggyback boards to selectively vary the properties of the transformer.

SUMMARY OF THE INVENTION

With parenthetical reference to the corresponding parts, portions or surfaces of the disclosed embodiment, merely for purposes of illustration and not by way of limitation, the present invention provides an improved transformer (20), which broadly includes: a substrate (21) having first and second surfaces (22, 23); a first board (24) mounted on the substrate first surface; a second board (25) mounted on the substrate second surface; the boards being identical to one another and being mounted on the respective proximate substrate surfaces as mirror images of one another; each of the boards having a plurality of dielectric layers with electrically-conductive sheet windings (35, 36, 37, 38) embedded therein; and cores (26, 28) operatively arranged to provide a path for magnetic flux attributable to a current in the some of the windings.

At least one winding (41) of the first board may be connected in series with at least one winding (41) of the second board, and these series-connected windings may form a part of the primary windings of the transformer.

At least one winding of the first board may be connected in parallel with at least one winding of the second board, and these parallel-connected windings may form a part of the secondary windings of the transformer.

At least one winding (43) of the first board and/or the second board may be independent of all other windings (43).

The core may be formed by assembling two core portions (26, 28). A first of the core portions may be arranged proximate the first board, and a second of the core portions may be arranged proximate the second board. At least one of the core portions may be E-shaped, and the other may be E- or I-shaped, or may have some other shape or configuration.

The substrate (21) may be a printed circuit board, and this printed circuit board may contain one or more of the transformer windings (30, 31).

The first and second boards (24, 25) may be formed by a printed circuit technique. Each board may include terminals (40) on a surface thereof that are adapted to electrically connect at least one of the windings (35, 36, 37, 38) within such board. In one form, each board has at least four terminals that are operatively arranged to allow different voltages to be tapped off the transformer, even with a mirrored PCB arrangement. Different windings within a board may be connected by vias (39).

At least one winding of the first board is connected to at least one winding of the second board by at least one via.

The transformer may possibly further include a third board (71) piggybacked on the first board (24) and electrically connected thereto, and may possibly include a fourth board (72) piggybacked on the second board (25) and electrically connected thereto. The third and fourth boards may be identical to one another, but different from the first and second boards. The third and fourth boards are preferably mounted on the first and second boards, respectively, as mirror images of one another. Each third and fourth board may have a plurality of terminals operatively arranged to allow different voltages to be tapped off the boards. At least one winding of the third board may be connected in parallel with at least one winding of the first board, and at least one winding of the fourth board may be connected in parallel with at least one winding of the second board. Those knowledgeable in the art of transformer design will appreciate that this paralleling results in a lower effective winding resistance, hence allowing for an increase in the power throughput of the transformer. At least one winding of the third board may be connected in series with at least one winding of the first board, and at least one winding of the fourth board may be connected in series with at least one winding of the second board.

Each board contains groups of terminations associated with the windings of that particular board, and the group of terminations on one board is arranged to provide adequate voltage clearance, in accordance with IPC standards, relative to the group of terminations on the same board or on an adjacent board.

In another aspect, the invention provides a motor controller incorporating any transformer as defined above and power switches, the transformer performing DC/DC step-down conversion supplying drivers of the power switches.

In one embodiment, the power switches are Insulated Gate Bipolar Transistor switches.

In a further aspect the invention provides a motor comprising any motor controller as defined above.

Accordingly, the general object of the invention is to provide an improved transformer.

Another object is to provide an improved low-profile transformer that is suitable for use in motor drive applications.

Another object is to provide a low-profile transformer in which the properties of the transformer (e.g., turns ratio, etc.) may be quickly and easily changed or modified by mounting standard components (i.e., third and fourth boards) onto the first and second boards.

Still another object is to provide a low-profile transformer in which two identical add-on boards may be mounted on the first and second boards as mirror images of one another.

Still another object is to provide an improved low-profile transformer in which each add-on board has a group of terminals associated with the various windings of that particular board to allow a desired voltage, or different voltages, to be tapped off that board.

These and other objects and advantages will become apparent from the foregoing and ongoing written specification, the drawings and the appended claims.

BRIEF DESCRIPTION OF THE DRAWING FIGURES

Figure 2:
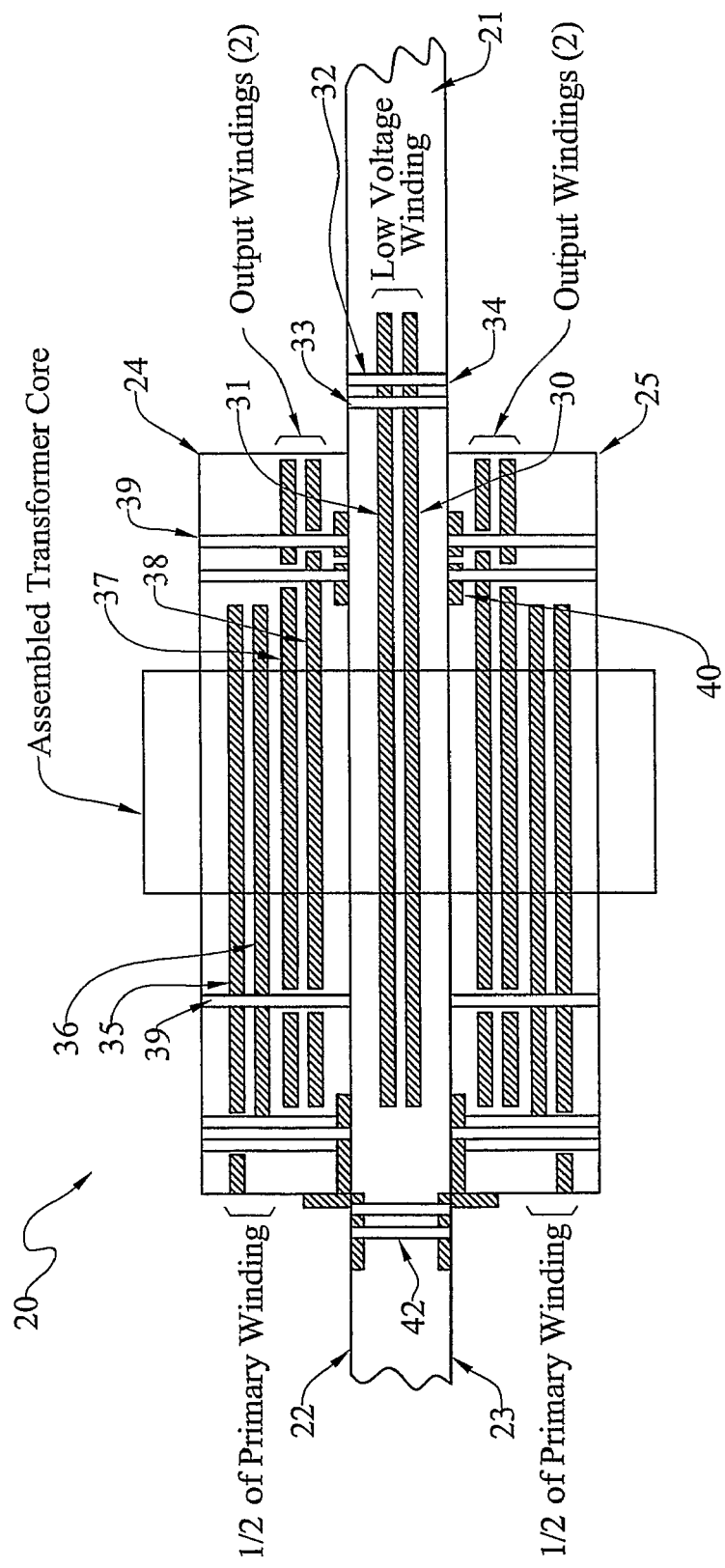
Figure 3:
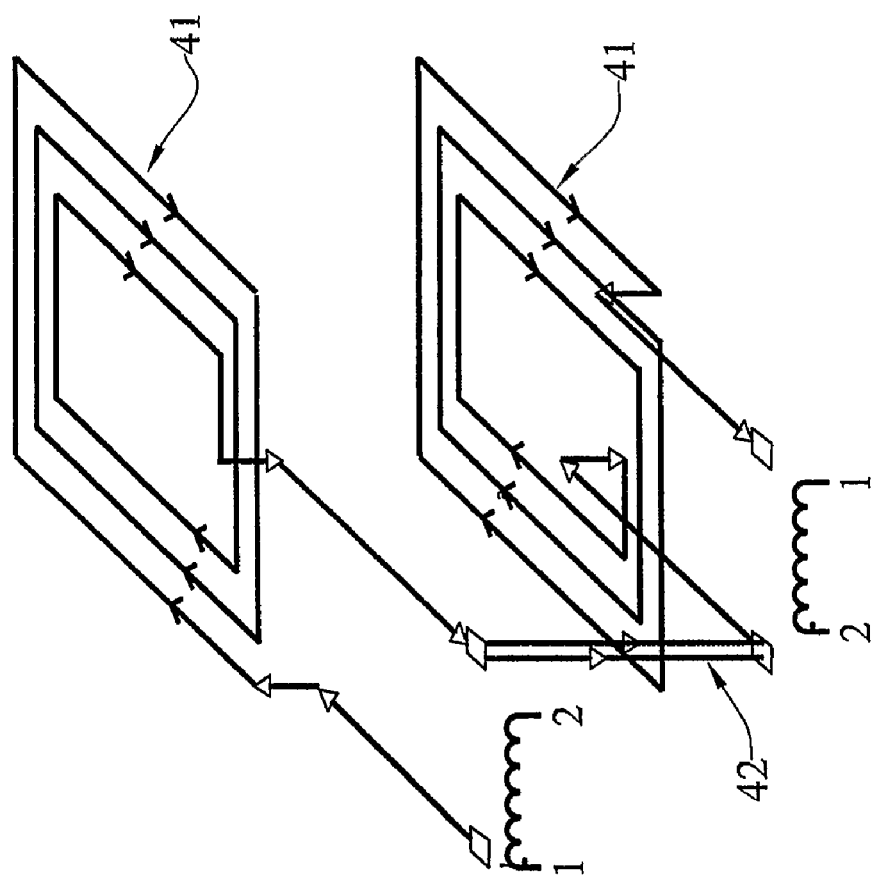
Figure 4:
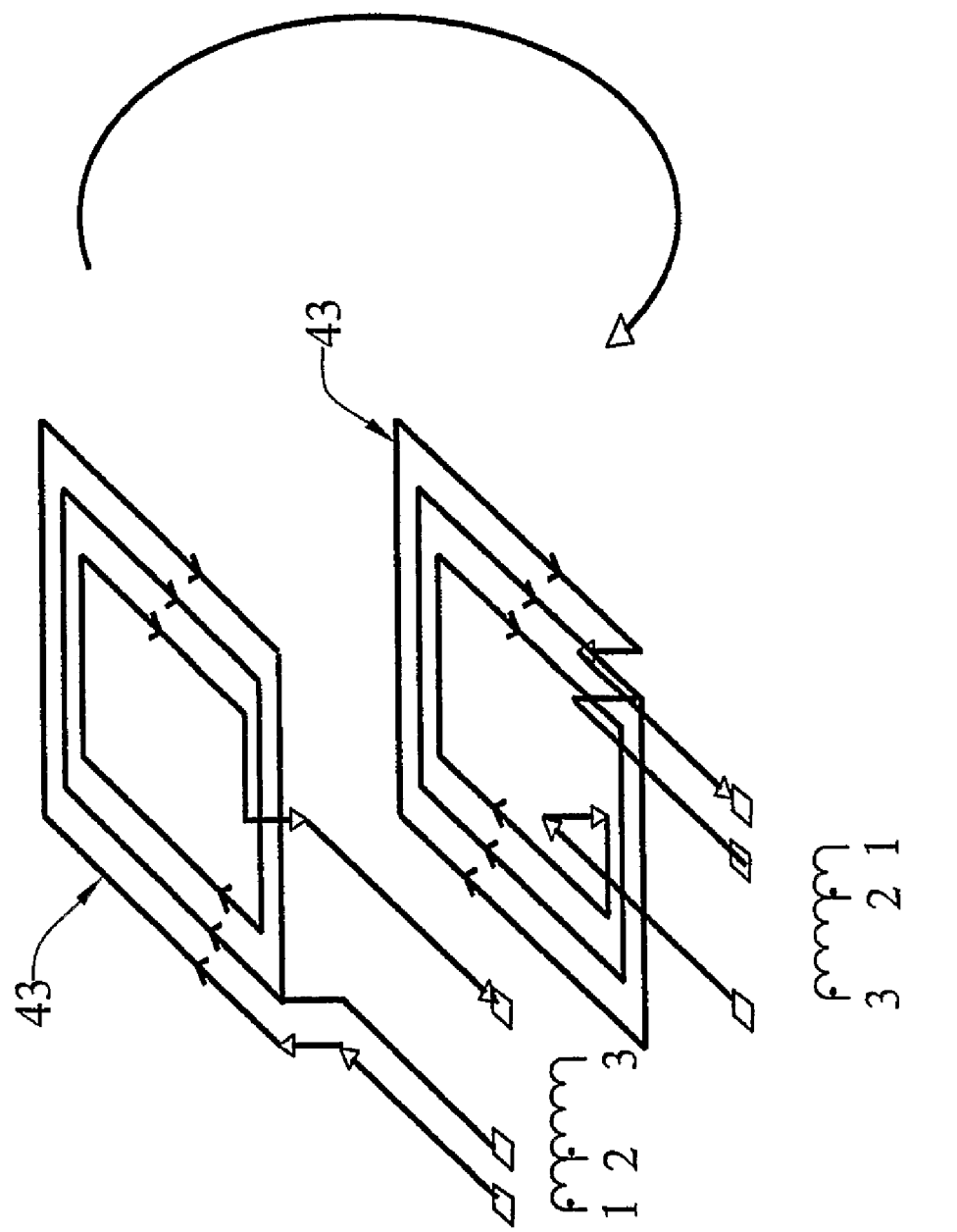
Figure 5:
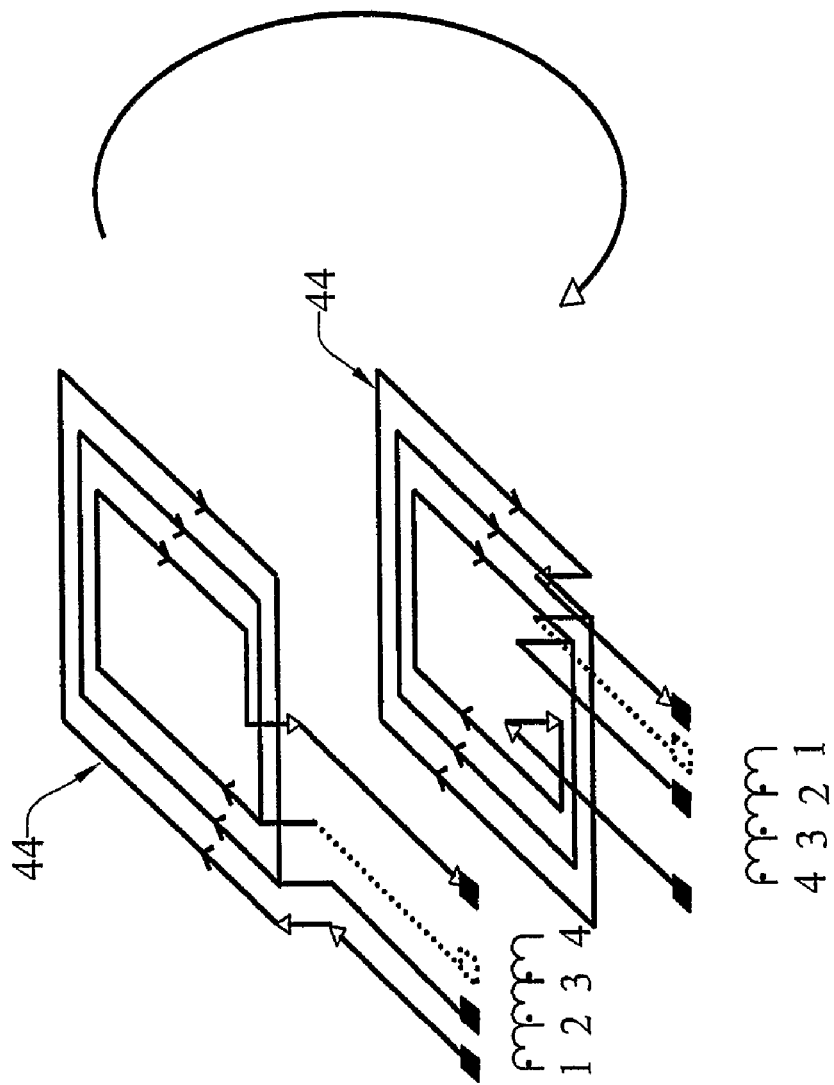
Figure 6A:
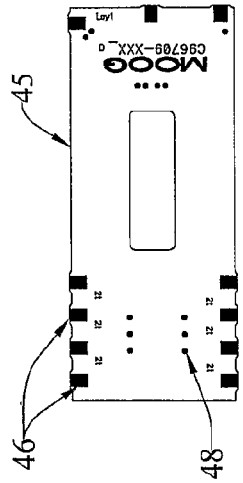
Figure 6B:
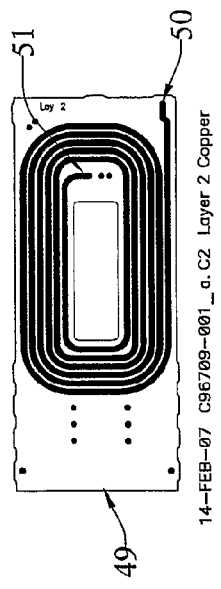
Figure 6C:
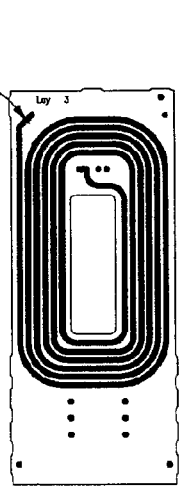
Figure 6D:
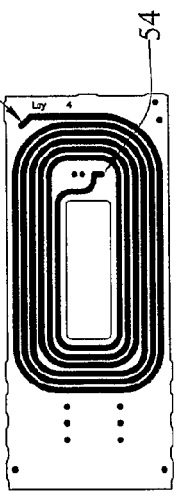
Figure 7A:
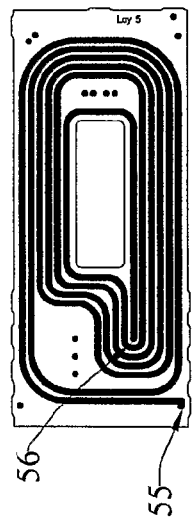
Figure 7B:
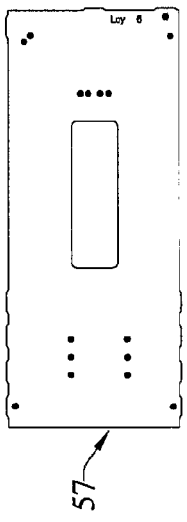
Figure 7C:
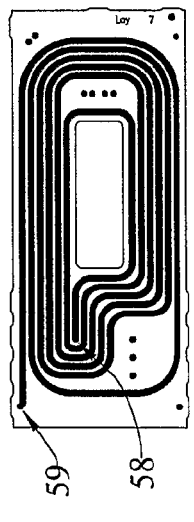
Figure 7D:
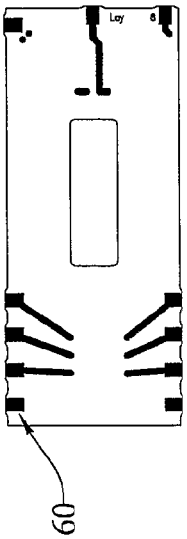
Figure 8:
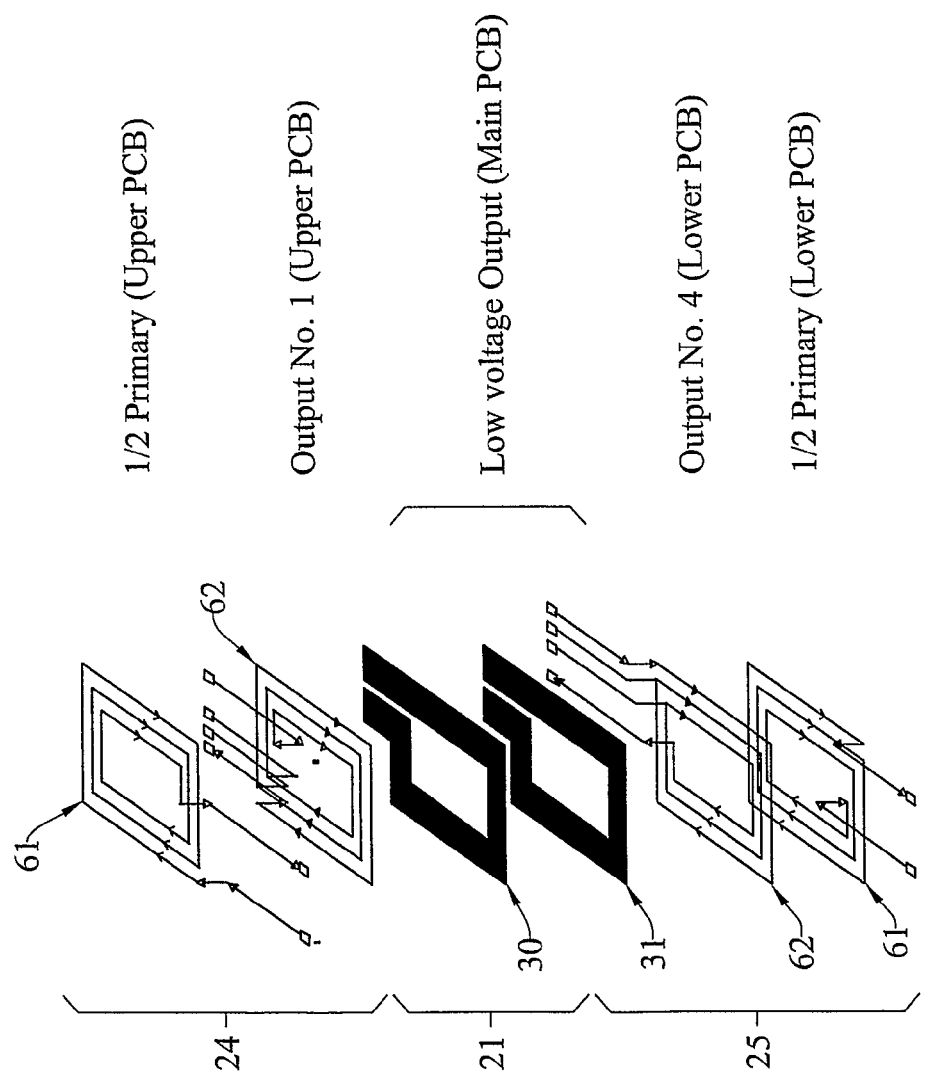
Figure 9:
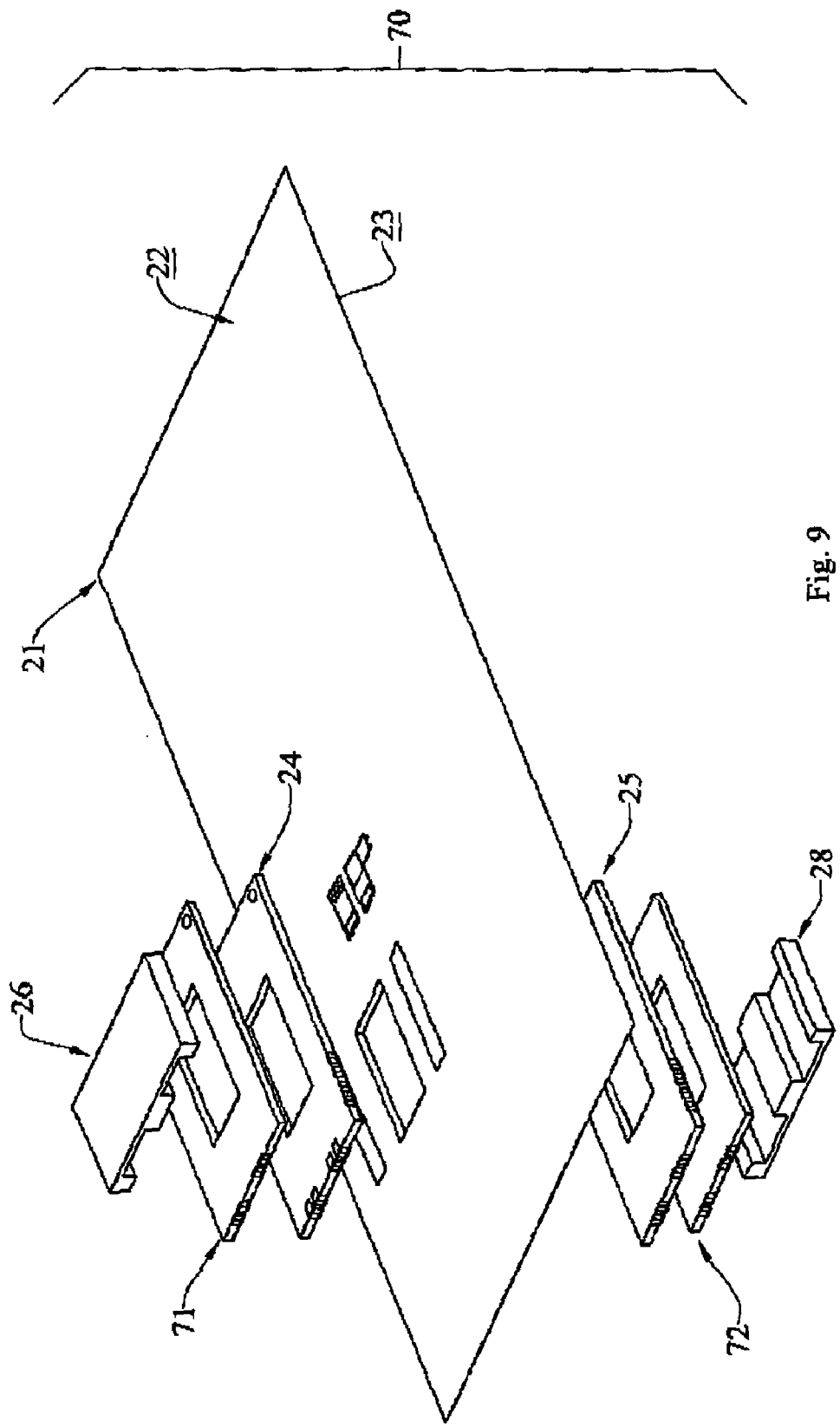
Figure 10:
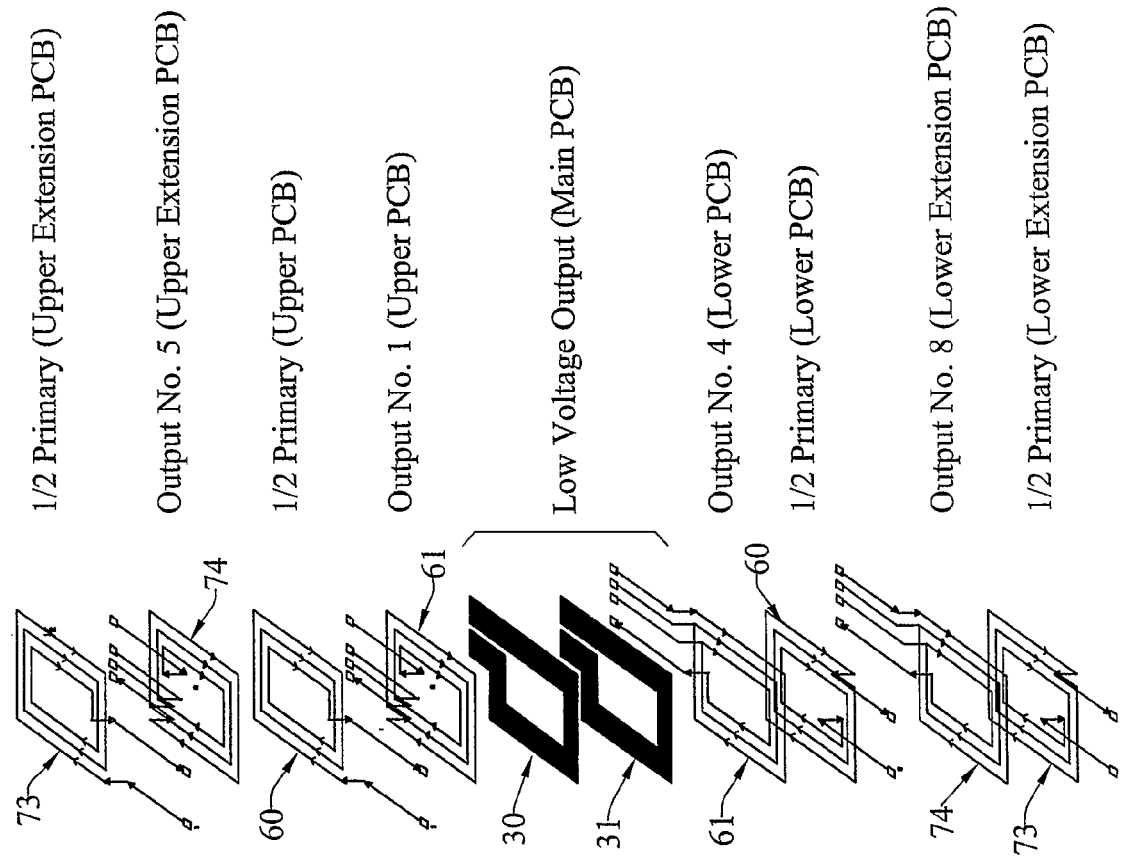

FIG. 1 is a schematic isometric view showing the first and second boards, and the two E-cores, in exploded aligned relation to the main printed circuit board, FIG. 2 is an enlarged fragmentary longitudinal cross-section of the assembled transformer that was shown in exploded relation in FIG. 1, and showing the various layers of each board, the assembled core structure, and the primary and secondary windings, FIG. 3 is a schematic isometric view showing first forms of some of the series connected windings within the first and second boards, and showing the first and second boards as being arranged as mirror images of one another, FIG. 4 is a schematic isometric view showing second forms of non-connected windings within the first and second boards, and showing the first and second boards as being arranged as mirror images of one another, FIG. 5 is a schematic isometric view showing third forms of non-connected windings within the first and second boards, and showing the first and second boards as being arranged as mirror images of one another, FIG. 6a is a top plan view of the top layer of the first board, showing the terminals of the primary and secondary windings spatially arranged about the PCB, FIG. 6b is a view of the embedded winding within the second layer from the top of the first board, this being part of the primary winding, FIG. 6c is a view of the embedded winding within the third layer from the top of the first board, this being part of the primary winding, FIG. 6d is a view of the embedded winding within the fourth layer from the top of the first board, this being part of the primary winding, FIG. 7a is a view of the embedded winding within the fifth layer from the top of the first board, this being a multi-tapped secondary winding, FIG. 7b is a view of the embedded via arrangement within the sixth layer from the top of the first board, this being effectively an unused layer of the PCB, FIG. 7c is a view of the embedded winding within the seventh layer from the top of the first board, this being another multi-tapped secondary winding, FIG. 7d is a bottom plan view of the eighth layer from the top of the first board (i.e., the bottom layer), this view showing the terminals leading to the center taps and terminations of the secondary windings, and also showing the completion of the primary winding, FIG. 8 is a simplified exploded aligned isometric schematic view of the transformer shown in FIG. 1, and shows the schematic windings of the first and second boards and the main substrate boards, but without the two E-cores, FIG. 9 is an exploded aligned isometric schematic view similar to FIG. 1, and shows the first, second, third and fourth boards, and the two E-cores, relative to the main board, and FIG. 10 is an exploded aligned isometric schematic view of the transformer shown in FIG. 9.

DESCRIPTION OF THE PREFERRED EMBODIMENTS

At the outset, it should be clearly understood that like reference numerals are intended to identify the same structural elements, portions or surfaces consistently throughout the several drawing figures, as such elements, portions or surfaces may be further described or explained by the entire written specification, of which this detailed description is an integral part. Unless otherwise indicated, the drawings are intended to be read (e.g., cross-hatching, arrangement of parts, proportion, degree, etc.) together with the specification, and are to be considered a portion of the entire written description of this invention. As used in the following description, the terms "horizontal", "vertical", "left", "right", "up" and "down", as well as adjectival and adverbial derivatives thereof (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

The present invention concerns the design and manufacture of low-profile transformers for motor drive applications wherein multiple isolated bias supplies are required. The improved transformer may include two or more core portions assembled onto a main printed circuit board (PCB), with two identical multi-layered printed circuit boards being mounted on the main board. The invention allows, through the novel design of the add-on boards, the use of identical planar PCBs, and, secondary PCBs (if desired), to reduce the number of different components required during manufacture.

The transformer may advantageously be used in a motor controller as a dc/dc step-down transformer supplying the drivers of power switches such as Insulated Gate Bipolar Transistors (IGBTs) and also supplying bias requirements to control circuits.

The basic assembly is shown in FIG. 1. In this view, various components of an improved transformer, generally indicated at 20, are shown in exploded aligned relation to one another. These various components include a main printed circuit board 21 having a planar upper surface 22 and a planar lower surface 23, a first board 24 adapted to be mounted on the substrate or main PCB board upper surface 22, a second board 25 positioned beneath the main board 21 and adapted to be mounted on main board second surface 23, and upper and lower E-cores 26, 28, respectively, that are adapted to embrace the first and second boards so as to provide a path for magnetic flux attributable to a current in some of the transformer windings. The first and second boards 24, 25 are preferably identical to one another, but are mounted on the respective proximate substrate surfaces 22, 23 as mirror-images of one another. The main board 21 is, in fact, a printed circuit board having a plurality of embedded sheet windings therein. The first and second boards are also manufactured by a suitable printed circuit board technique, and include a plurality of dielectric layers with various sheet windings embedded therein, as discussed infra. The first and second boards 24, 25 are shown as having a plurality of terminals, severally indicated at 29.

FIG. 2 is an enlarged fragmentary longitudinal vertical sectional view of the transformer shown in FIG. 1, after assembly. This view again shows the main printed circuit board 21 as having upper and lower surfaces 22, 23, respectively. The first and second boards 24, 25 are shown as being mounted on these respective substrate surfaces 22, 23, respectively. The main printed circuit board 21 is depicted as having a plurality of dielectric layers. Two vertically-spaced series-connected low-voltage windings, indicated at 30, 31, are disposed within the main printed circuit board. These windings are connected via vias 32 which lead to terminals 33, 34 on the upper and lower surfaces of the main printed circuit board.

As previously noted, the first and second boards are preferably structurally identical, so as to minimize the number and type of different components of the transformer, and are mounted on the proximate surfaces of the main printed circuit board as mirror-images of one another. Each of boards 24, 25 may be formed by a suitable printed circuit board technique, and may have a plurality of sheet windings, indicated at 35, 36, 37 and 38, respectively, arranged within various respective vertically-spaced dielectric layers. Various of these windings are connected by vias, severally indicated at 39, which terminate in terminals 40 at one surface of the associated board. In the accompanying drawings, numeral 39 refers generally to a via and numeral 40 refers to a terminal connected with that via. That is not to say that all vias are the same, or that all vias are connected to the same sheet windings within the associated board.

FIG. 3 is a schematic view of a sheet winding in one board as being series-connected to another identical board arranged as a mirror-image of the first. Note that terminals "2" of the boards are connected via a via 42 in the main PCB. Thus, a suitable voltage may be impressed between terminal "1" of the upper board and terminal "1" of the lower board, to cause current to flow in a clockwise direction, spiraling inwardly in the upper board and outwardly in the lower board. Thus, FIG. 3 illustrates the two mirror-image windings (41, 41) as being series-connected.

FIG. 4 is a schematic view of another arrangement, generally similar to that shown in FIG. 3, in which an upper winding 43 is arranged as a minor-image to a lower winding 43. These windings have an off-center tap that produces unequal voltages at the output of the transformer. Those knowledgeable in the art of transformer design will appreciate that the off-center tap arrangements result in different voltages being produced at the outputs of the top windings in comparison to those produced at the outputs of the bottom winding due to the fact that the windings are mirrored. Terminals "1" and "3" of the winding shown in FIG. 4 correspond generally to terminals "1" and "2" in the winding shown in FIG. 3. The principal difference is that there is an off-center tap leading to an intermediate terminal "2". This allows an interim voltage to be tapped off. The interim voltage tapped off in the upper winding 43 is not equivalent to the interim voltage tapped off the lower winding 43, due to the fact that the tapping is off center.

FIG. 5 is a schematic view of a corrected form of winding shown in FIG. 4. The upper winding makes use of terminals "1", "2" and "4", whereas the lower winding makes use of terminals "4", "3" and "1". In other words, terminal "3" is unused in the upper winding, and terminal "2" is unused in the lower winding. This arrangement allows equivalent voltages to be achieved from upper and lower windings with the additional taps. Thus, the additional tap in each winding enables compensation of the off-center tap combined with a mirrored PCB.

FIGS. 6 and 7 are schematic views of the eight layers forming the upper board 24. FIG. 6a is a top plan view of the uppermost layer 45. Layer 45 is shown as having a plurality of spaced rectangular terminals, severally indicated at 46, and a plurality of spaced vertical round vias, indicated at 48.

FIG. 6b is a schematic view of the sheet winding in the second layer from the top, this being immediately beneath the top layer. Note that current may flow from terminal 50 in a clockwise direction and may spiral inwardly to a termination 51. A via communicates the inner end of the coil shown in FIG. 6b with the inner end of a coil on the third layer from the top, as shown in FIG. 6c. Hence, in the third layer, current may spiral outwardly toward a terminal 52. Referring now to FIG. 6d, terminal 52 communicates via a via with an input terminal 53 on the fourth layer from the top. This terminal is connected via a sheet winding that spirals inwardly and terminates at an output 54. Terminal 54 is adapted to communicate via a via with a mirror-image in the arrangement in the lower board.

Referring to FIG. 7a, the fifth layer from the top of the upper board is shown as having another sheet winding that begins at an input 55 and terminates at an output 56. The input 55 and output 56 on the fifth layer communicate via the vias shown in FIG. 7b to terminations on the eighth layer, as shown in FIG. 7d. Taps from this winding are taken from vias located at interim points in the winding, and these taps also communicate with the terminations on the eighth layer via vias. Another complete winding is shown on the seventh layer from the top, as shown in FIG. 7c. This winding spirals inwardly between an input 59 and an output 58. This winding also contains several vias spatially arranged to provide off-center taps and terminations, as seen in FIG. 7b.

As best shown in FIGS. 7c-7d, input 59 communicates with a terminal 60.

FIG. 8 is a schematic view of the assembled transformer. The main PCB is shown as having two low-voltage output windings 30, 31. The first board 24 is shown as having one half of the primary winding, indicated at 61. In fact, winding 61 may be represented by a plurality of series-connected windings on the various layers of the upper board. The upper board is also depicted as having an output winding, indicated at 62, which may, in fact, be on multiple layers. The uppermost winding 61 is shown as having terminals at positions "1" and "2", and the output winding 62 is shown as having four output terminals. The lower board 25 is arranged as a mirror-image of the upper board, and has a primary winding 61 and a secondary winding 62, as indicated above.

Referring now to FIGS. 9 and 10, the present invention expressly contemplates that one or more additional boards, termed third and fourth boards, respectively, may be mounted on or "piggybacked" on the first and second boards, respectively, to improve or extend the electrical properties of the transformer. In FIG. 9, the assembly is shown in an exploded aligned relation. The improved transformer, generally indicated at 70, is shown again as including a main printed circuit board 21 having upper and lower surfaces 22, 23, respectively; a first board 24; a second board 25; and upper and lower E-cores 26, 28 of the core. However, in this form, a third board, generally indicated at 71, is mounted on the first board 24, and is embraced by the E-core. Similarly, a fourth board, generally indicated at 72, is mounted on the second board 25, and is embraced by E-core 28. The third and fourth boards 71, 72 are identical to one another, but are mounted on the first and second boards, respectively, as mirror-images of one another. These third and fourth boards have terminals or groups of terminals that communicate with internal windings therein, and can be readily used to expand the capacity of the first and second boards. For example, the third and fourth boards might contain additional primary windings that can be parallel-connected to the windings of the first and second boards. Alternatively, the third and fourth boards may have additional secondary windings that can be electrically connected to the secondary windings of the first and second boards. Alternatively, these third and fourth boards may have additional secondary windings that increase the number of output voltages from the transformer.

FIG. 10 is a schematic view of the structure shown in FIG. 9. The two coils 30, 31 within the main circuit board 21 are in the center of this view. Above and below the main circuit board are representations as to the first and second boards 24, 25, respectively. These boards are depicted as having various layers embedded therein. For example, first board 24 is depicted as having a primary winding 60 and a secondary winding 61. Similarly, the second board is depicted as having a primary winding 60 and a secondary winding 61. The third and fourth boards are depicted as having additional primary windings, generally indicated at 73 and secondary windings, generally indicated at 74. These various windings are adapted to communicate the corresponding windings in the first and second boards by their array of terminals and vias connecting these terminals.

Modifications

The present invention expressly contemplates that many different changes and modifications may be made. For example, while it is presently preferred that the various boards be constructive according to printed circuit board techniques, other types of constructional techniques might possibly be used. The number of layers is not deemed critical. The particular winding patterns are not deemed critical, albeit they must be governed by the ultimate end use. As indicated, the third and fourth boards may be piggybacked onto the first and second boards, respectively, if desired. The array of vias and groups of terminals is considered to be well within the ambit of a person skilled in this art.

Therefore, while several forms of the improved transformer have been shown and described, and several modifications thereof discussed, persons skilled in this art will readily appreciate that various additional changes and modifications may be made without departing from the spirit of the invention, as defined and differentiated by the following claims.

The invention claimed is:

1. A transformer, comprising:
a substrate having first and second surfaces;
a first board mounted on said substrate first surface;
a second board mounted on said substrate second surface;
said first and second boards being identical to one another and being mounted on the respective proximate substrate surfaces as mirror images of one another;
each of said first and second boards having a plurality of dielectric layers with electrically-conductive sheet windings embedded therein;
said sheet windings being electrically connected;
a core operatively arranged to provide a path for magnetic flux attributable to a current in said windings; and
wherein each of said first and second boards has at least three terminals on a surface thereof that are electrically connected to at least one winding within such board and that are operatively arranged to allow different voltages to be tapped off.

2. A transformer as set forth in claim 1, wherein at least one winding of said first board is connected in series with at least one winding of said second board.

3. A transformer as set forth in claim 2, wherein said series-connected windings form a part of the primary windings of said transformer.

4. A transformer as set forth in claim 1, wherein at least one, winding of said first board is connected in parallel with at least one winding of said second board.

5. A transformer as set forth in claim 4, wherein said parallel-connected windings form a part of the secondary windings of said transformer.

6. A transformer as set forth in claim 1, wherein at least one winding of said first board is independent of all other windings.

7. A transformer as set forth in claim 1, wherein at least one, winding of said second board is independent of all other windings.

8. A transformer as set forth in claim 1, wherein said core is formed by assembling two core portions, wherein a first of said core portions is arranged proximate said first board, and wherein a second of said core portions is arranged proximate said second board.

9. A transformer as set forth in claim 8, wherein at least one of said core portions is E-shaped.

10. A transformer as set forth in claim 8, wherein at least one of said core portions is I-shaped.

11. A transformer as set forth in claim 1, wherein said substrate is a printed circuit board.

12. A transformer as set forth in claim 11, wherein at least one of said transformer windings is located within said printed circuit board.

13. A transformer as set forth in claim 1, wherein said first and second boards are formed by a printed circuit technique.

14. A transformer as set forth in claim 1, wherein different windings within a board are connected by vias.

15. A transformer as set forth in claim 1, wherein at least one winding of said first board is connected to at least one winding of said second board by at least one via.

16. A transformer as set forth in claim 1, and further comprising a third board mounted on said first board and electrically connected thereto, and wherein at least one winding of said third board is electrically connected to at least one winding of said first board.

17. A transformer as set forth in claim 1, and further comprising a fourth board mounted on said second board and electrically connected thereto, and wherein at least one winding of said fourth board is electrically connected to at least one winding of said second board.

18. A transformer as set forth in claim 17, wherein said third and fourth boards are identical.

19. A transformer as set forth in claim 17, wherein said third and fourth boards are not identical to said first and second boards.

20. A transformer as set forth in claim 18 wherein said third and fourth boards are mounted on said first and second boards, respectively, as mirror images of one another.

21. A transformer as set forth in claim 17, wherein said third and fourth boards each have at least three terminals on a surface thereof that are electrically connected to at least one winding with such board, and that are operatively arranged to allow different voltages to be tapped off.

22. A transformer as set forth in claim 17, wherein at least one winding of said third board is connected in parallel with at least one winding of said first board, and wherein at least one winding of said fourth board is connected in parallel with at least one winding of said second board.

23. A transformer as set forth in claim 17, wherein at least one winding of said third board is connected in series with at least one winding of said first board, and wherein at least one winding of said fourth board is connected in series with at least one winding of said second board.

24. A transformer as set forth in claim 1, wherein each board contains groups of terminations associated with the windings of that particular board.

25. A transformer as set forth in claim 24, wherein the group of terminations on one board is arranged to provide adequate voltage clearance relative to the group of terminations on an adjacent board.

* * * * *